(12) United States Patent
Chang

(10) Patent No.: US 7,111,667 B2
(45) Date of Patent: Sep. 26, 2006

(54) HEAT DISSIPATING DEVICE

(75) Inventor: Hung Chang, Taipei (TW)

(73) Assignee: Micro-Star Int'l Co., Ltd., Taipei (TW)

( * ) Notice: Subject to any disclaimer, the term of this patent is extended or adjusted under 35 U.S.C. 154(b) by 379 days.

(21) Appl. No.: 10/401,550

(22) Filed: Mar. 31, 2003

(65) Prior Publication Data

US 2004/0188063 A1 Sep. 30, 2004

(51) Int. Cl.
*F28F 7/00* (2006.01)

(52) U.S. Cl. .............. 165/80.3; 165/185; 165/104.33; 361/697; 361/703; 361/710; 174/16.3; 257/706

(58) Field of Classification Search ............ 165/80.3, 165/185, 104.33, 104.21; 361/697, 702–710; 257/707, 722, 706; 174/16.3
See application file for complete search history.

(56) References Cited

U.S. PATENT DOCUMENTS

| | | | | |
|---|---|---|---|---|
| 5,255,738 A | * | 10/1993 | Przilas | 165/185 |
| 5,285,108 A | * | 2/1994 | Hastings et al. | 257/712 |
| 5,653,280 A | * | 8/1997 | Porter | 165/80.3 |
| 5,760,333 A | * | 6/1998 | Kitahara et al. | 174/16.3 |
| 5,959,837 A | * | 9/1999 | Yu | 361/697 |
| 6,102,110 A | * | 8/2000 | Julien et al. | 165/104.33 |
| 6,105,662 A | * | 8/2000 | Suzuki | 165/104.33 |
| 6,446,707 B1 | * | 9/2002 | White | 165/80.3 |
| 6,532,141 B1 | * | 3/2003 | Wu | 165/80.3 |
| 6,598,666 B1 | * | 7/2003 | Lin | 165/80.3 |
| 6,626,233 B1 | * | 9/2003 | Connors | 165/80.3 |
| 2003/0002252 A1 | * | 1/2003 | Pokharna et al. | 361/697 |
| 2003/0019610 A1 | * | 1/2003 | Liu | 165/80.3 |

\* cited by examiner

*Primary Examiner*—Terrell Mckinnon
(74) *Attorney, Agent, or Firm*—Birch, Stewart, Kolasch & Birch, LLP

(57) ABSTRACT

A heat dissipating device for taking away heat from a plurality of heat sources is disclosed. It includes a plurality of heat sinks installed on heat sources and a heat conductor connected to the heat sinks. When a temperature difference is generated among the heat sources in work, the heat conductor can pass the heat from a hot heat sink to cooler ones. This enables heat transfers among the heat sinks to increase the heat dissipating efficiency.

14 Claims, 9 Drawing Sheets

HEAT DISSIPATING DEVICE

BACKGROUND OF THE INVENTION

1. Field of Invention

The invention pertains to a heat dissipating device used in an electronic device for taking heat away from a hot element therein (such as the CPU in a computer system). In particular, it relates to a heat dissipating device that can take away heat from several heat-generating elements.

2. Related Art

In a computer system, the central processing unit (CPU) is in charge of data processing and generates heat during operations. If its temperature is too high, the heat may damage the CPU. Therefore, a heat sink is usually installed on the CPU in the computer system. A fan is further installed on top of or on one side of the heat sink. Therefore, the heat produced by the working CPU is passed to the heat sink and then taken away by the air blown in by the fan. This means can lower the working temperature of the CPU, maintaining the normal operations.

With the increase of multi-tasking demands, the computer system requires a more powerful operational ability. A more powerful CPU is thus needed to process complicated data. In addition to the increasing operational frequency, some manufacturers even propose computer systems with double CPU's. The double-CPU system uses two CPU's to process different tasks. The heat dissipation design for the double-CPU system is still the same as that of the single-CPU ones. Each processor is independently installed with a heat sink and a fan. Since the two CPU's in the double-CPU system perform their jobs according to system requests, sometimes only one CPU is running while the other is idle. Even if both of them are running at the same time, they may produce different amounts of heat due to the different operations. In such cases, the idle CPU also has an idle heat sink or the CPU running less diligently has a lower temperature. Therefore, the corresponding heat sink does not reach its maximal efficiency.

SUMMARY OF THE INVENTION

The heat dissipation design of the conventional double-CPU computer system is only for individual processors. The heat sinks cannot support each other when the two processors are running under different loads. Thus, the whole heat dissipating system is not optimized.

In view of the foregoing, an objective of the invention is to provide a heat dissipating device that enables individual heat sinks to support one another according to the actual loads of the processors for increasing the heat dissipation efficiency of the whole system.

The disclosed heat dissipating device includes several heat sinks and a heat conductor. Each heat sink is installed on a corresponding heat source. The heat conductor connects the heat sinks so that the heat absorbed by the heat sinks can be transferred from one with a relatively high temperature to another with a relatively low temperature. Therefore, the heat sinks can share the heat produced by the heat sources.

The disclosed heat dissipating device makes use of the principle that heat always flow from a high-temperature place to a low-temperature one. A heat conductor connects the plurality of heat sinks so that any idle heat sink can help dissipating heat from hotter ones. The efficiency of the whole heat sink system is thus higher.

BRIEF DESCRIPTION OF THE DRAWINGS

The invention will become more fully understood from the detailed description given hereinbelow illustration only, and thus are not limitative of the present invention, and wherein.

DETAILED DESCRIPTION OF THE INVENTION

The disclosed heat dissipating device is used in an electronic device that generates heat during work. The electronic device can be a personal computer (PC), a laptop computer, or other similar products. The PC or laptop computer has at least one main heat source, which is the central processing unit (CPU). The CPU generates a certain amount of heat during operations. Therefore, the heat has to be carried away in order for the CPU to run normally. The disclosed heat dissipating device is mainly used in a computer system with two processors. However, the invention is not limited to the CPU as the heat sources. The number of heat sources is not limited to two, either.

Figure 1:
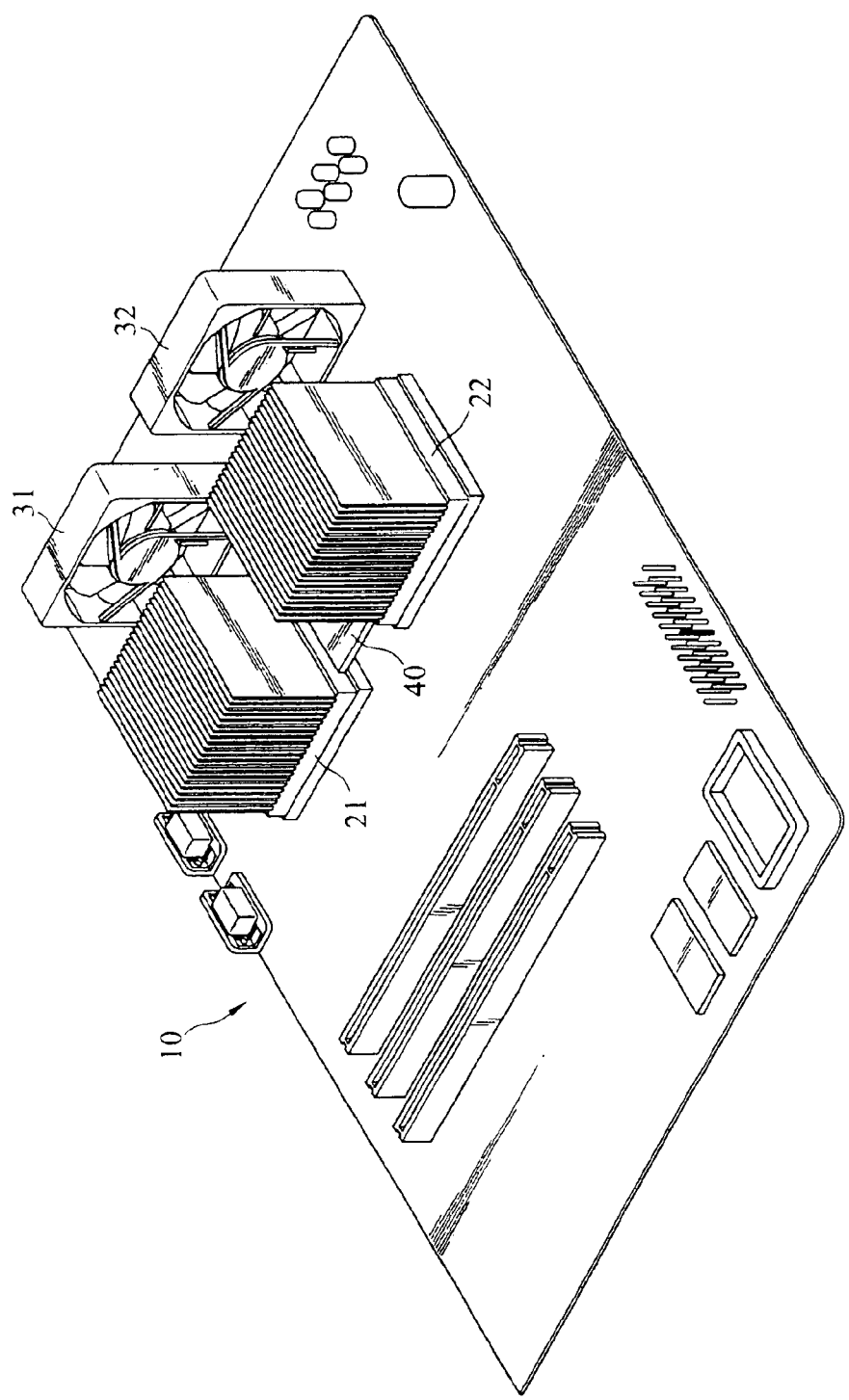
FIG. 1 is a first embodiment of the invention.
Figure 2A:
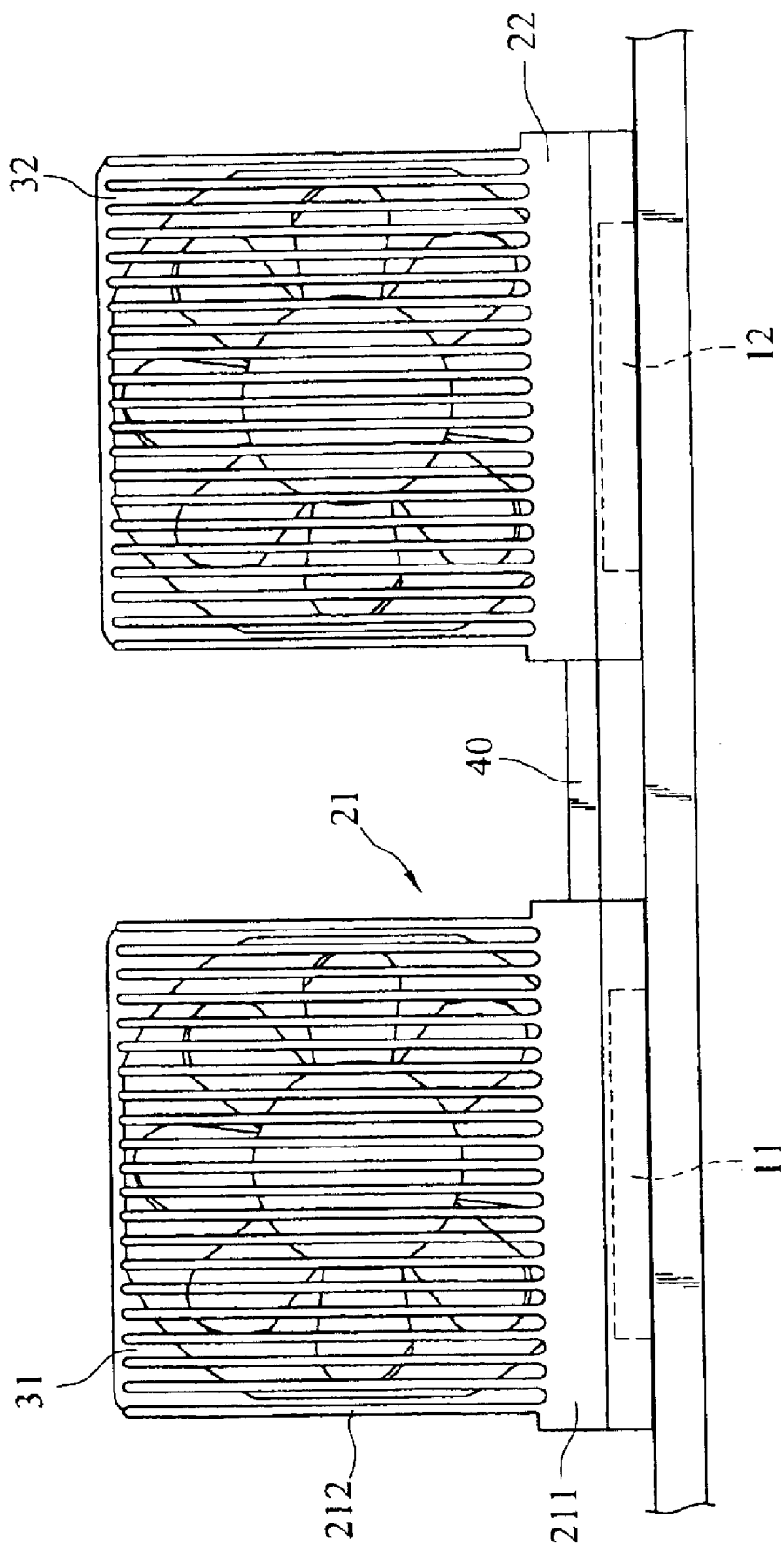
FIGS. 2A and 2B are side and top views of FIG. 1.
Figure 2B:
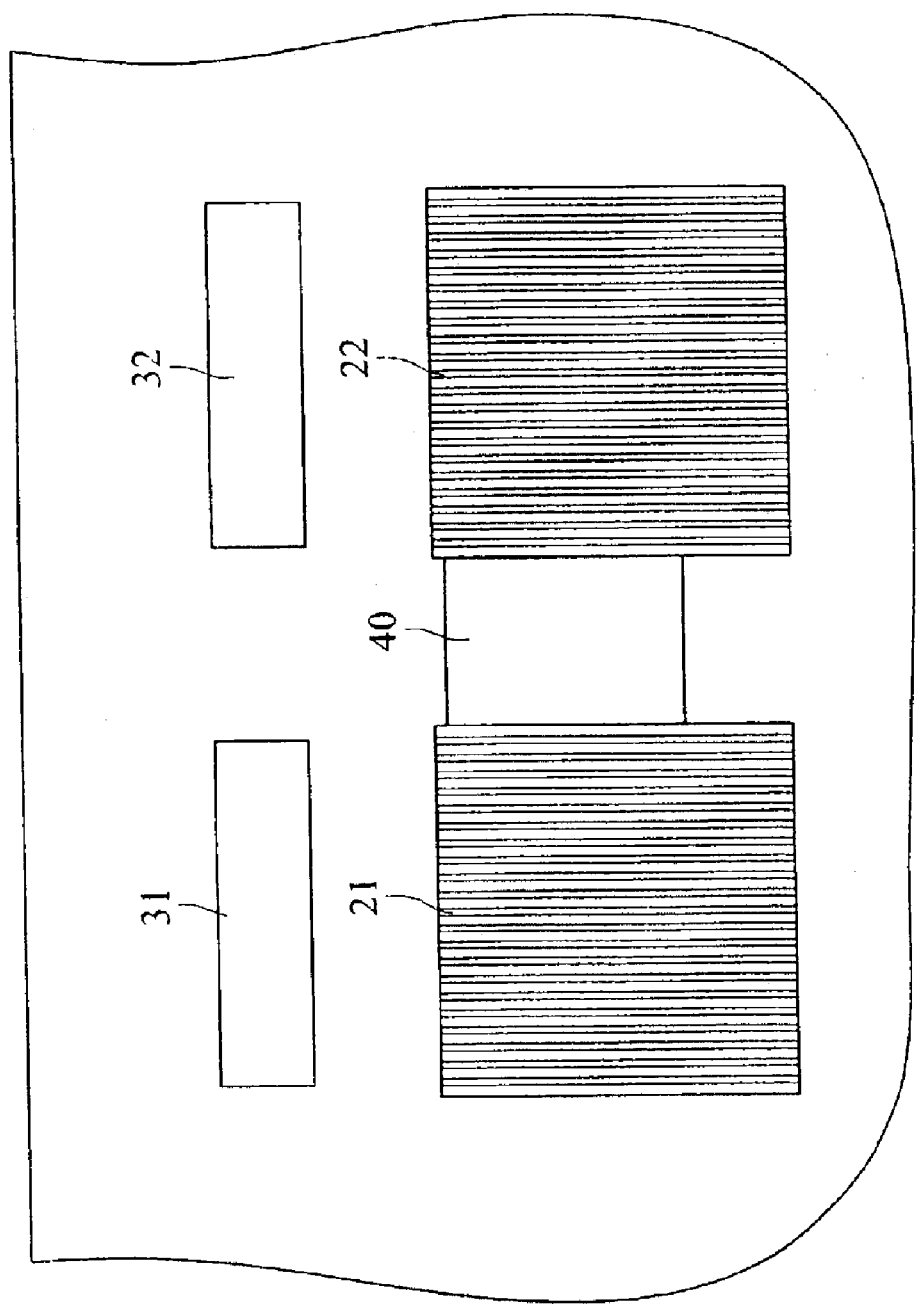

As shown in FIGS. 1, 2A, and 2B, the electronic device 10 is a computer system, whose technical details are well known and not repeated herein. The electronic device 10 has at least two heat sources 11, 12, which are the CPU's. Thy generate heat during work.

First Embodiment

The heat dissipating device in this embodiment has two heat sinks 21, 22 corresponding to the two heat sources 11, 12, two fans 31, 32 corresponding to the heat sinks 21, 22, respectively, and a heat conductor 40. The heat sink 21 (similarly for the heat sink 22) is made of aluminum or copper that is highly thermal conductive. It consists of a base 211 and several fins 212 on the base 211. The base 211 is in direct contact with the heat source 11. The purpose of the fins 212 is to increase the heat dissipation area. When the heat source 11 generates heat during operations, the heat is transferred to the base 211 and in turn to the fins 212. The fins 212 exchange heat with the ambient air to lower its temperature.

The fans 31, 32 can be installed on one side of the heat sinks 21, 22, respectively (see FIG. 1), or directly on the heat sinks 21, 22 (not shown). The fans 31, 33 blow ambient air toward the fins 212 so that the heat thereon can be brought away.

The heat conductor 40 is a plate made of aluminum or copper that is highly thermal conductive. It can be attached onto the heat sinks 21 22 using a heat-conductive adhesive (not shown), so that the heat sinks 21, 22 can exchange heat via the heat conductor 40.

Heat transfers from a high-temperature place to a low-temperature one. Suppose the heat source 11 has a larger load in operation and the heat source 12 has a lower one (or is even idle), then the heat sink 21 has a relatively higher temperature and the heat sink 22 lower. The temperature difference between the heat sinks 21, 22 makes the heat transfer from the heat sink 21 to the heat sink 22 via the heat conductor 40. Consequently, the heat dissipation area of the heat source 21 with a larger load is increased.

Please refer to Attachments 1 and 2. Attachment 1 is a test plot of the internal heat distribution of a running electronic device 10 that uses a conventional heat dissipating device; attachment 2 is that of a running electronic device 10 that uses the disclosed heat dissipating device. Comparing Attachments 1 and 2, one sees that the disclosed heat dissipating device can indeed greatly increase the heat dissipation efficiency of the system.

Second Embodiment

Figure 3:
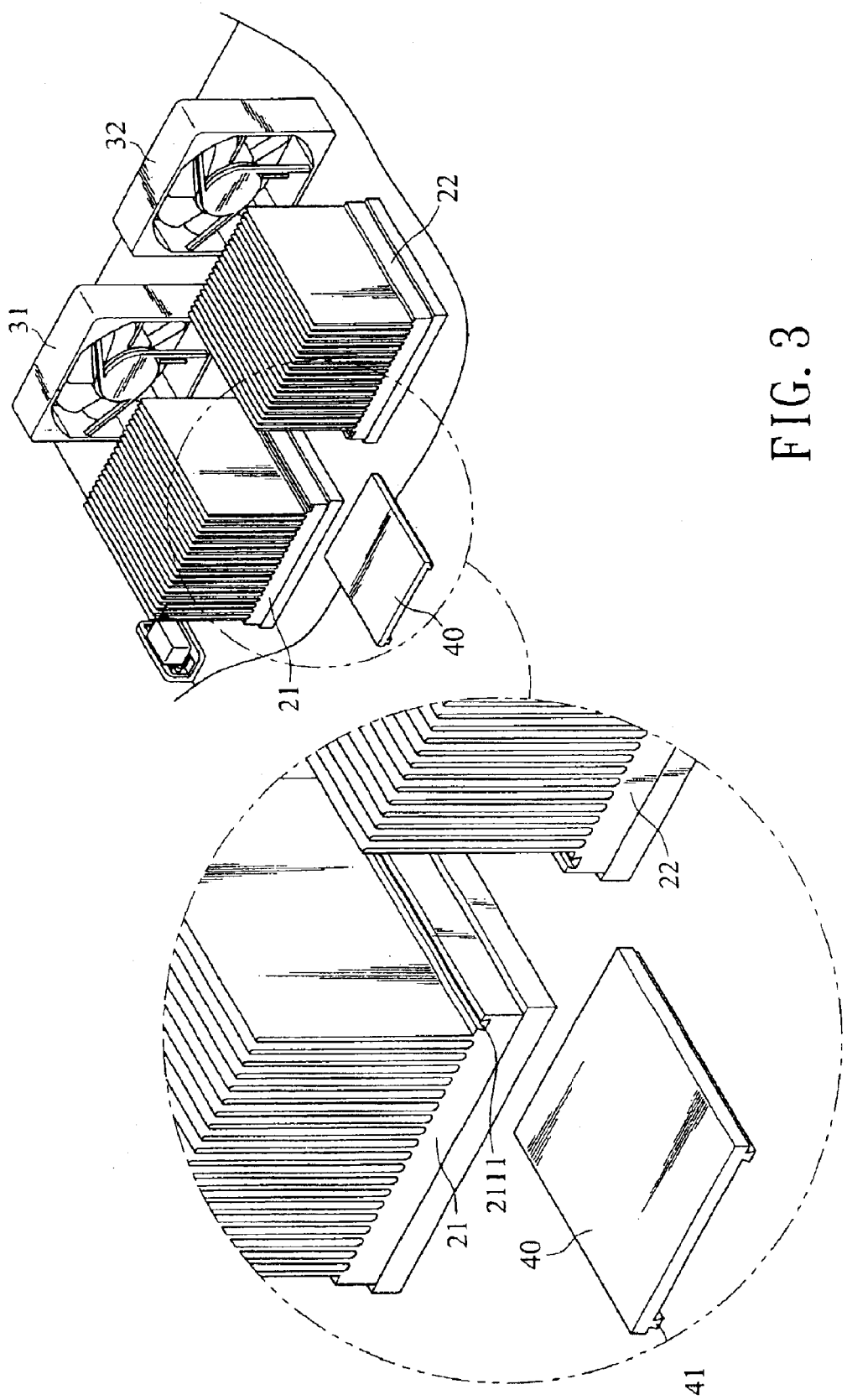
FIG. 3 is a second embodiment of the invention.

In the first embodiment, the heat conductor 40 is attached to the heat sinks 21, 22 by a heat-conductive adhesive. Since there is little possibility for a normal user to replace the CPU for upgrading the hardware equipment, such a method will not cause any trouble. Even for a professional computer user, he or she can use appropriate tools to take off the heat conductor 40 if necessary. After the replacement, the user only need to stick the heat conductor 40 on the heat sinks 21, 22 using the heat-conductive adhesive again (as shown in FIG. 3). In the second embodiment of the invention, the heat conductor 40 is installed on the heat sinks 21, 22 in a dismountable way. The base 211 of the heat sink 21 (similarly for the heat sink 22) has a click slot 2111. The heat conductor 40 has a corresponding clicking block 41 that matches with the clicking slot 2111. Therefore, when the user wants to upgrade the CPU, the heat conductor 40 can be directly taken off or installed on the heat sinks 21, 22 without using any tool.

Third Embodiment

Figure 4:
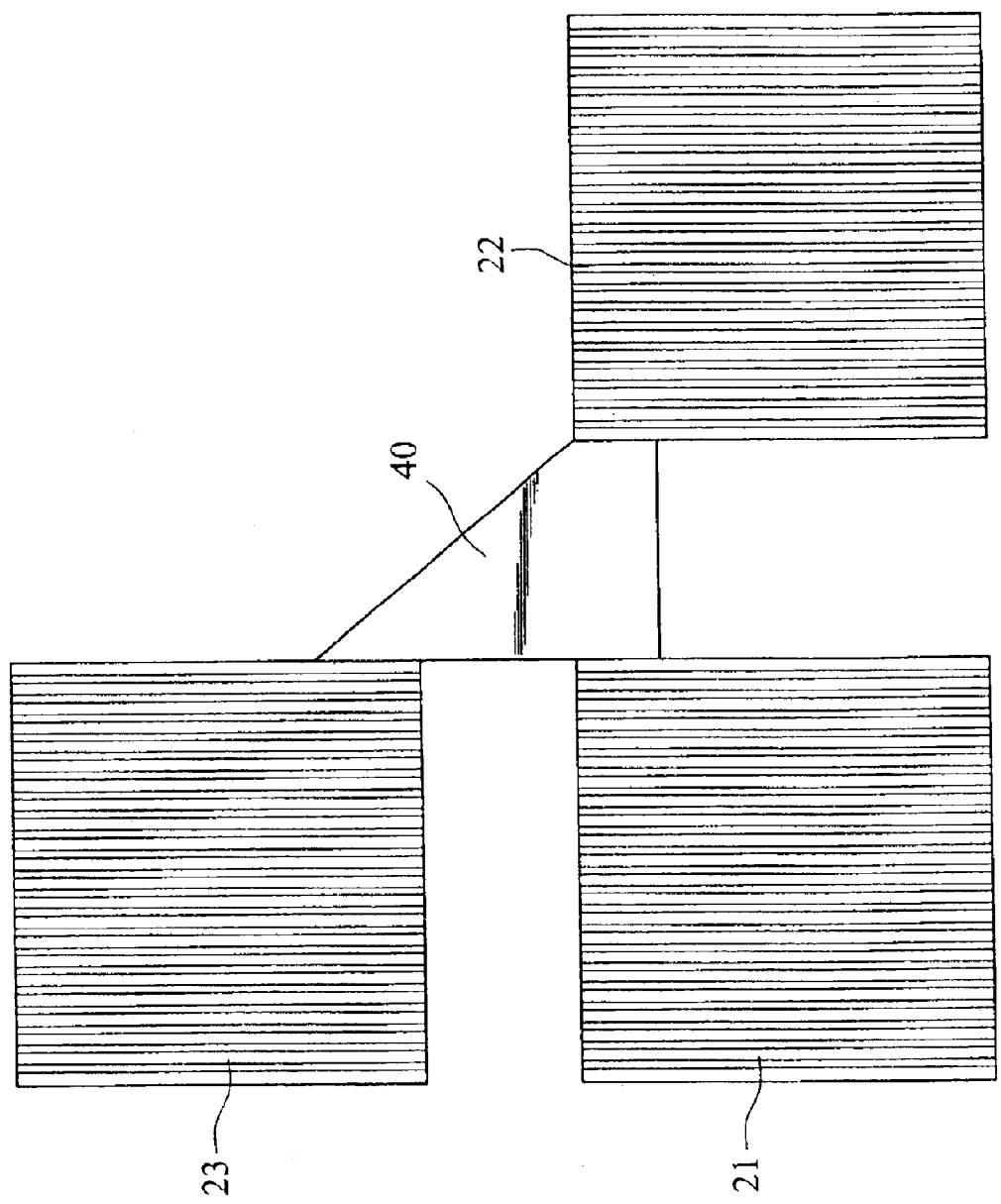
FIG. 4 is a third embodiment of the invention.

In the first and second embodiments, the two heat sinks 21, 22 correspond to two heat sources 11, 12. The two heat sinks 21, 22 exchange heat according to the temperature condition via the heat conductor 40. As shown in FIG. 4, the electronic device 10 has an additional heat source 13 that require heat dissipation in the third embodiment. Thus, an additional heat sink 23 is needed. The heat conductor 40 is attached to all the heat sinks 21, 22, 23. Similarly, when any heat sink has a high temperature than others, heat is transferred from it to the others via the heat conductor 40 to increase the heat dissipation efficiency.

Fourth Embodiment

Figure 5:
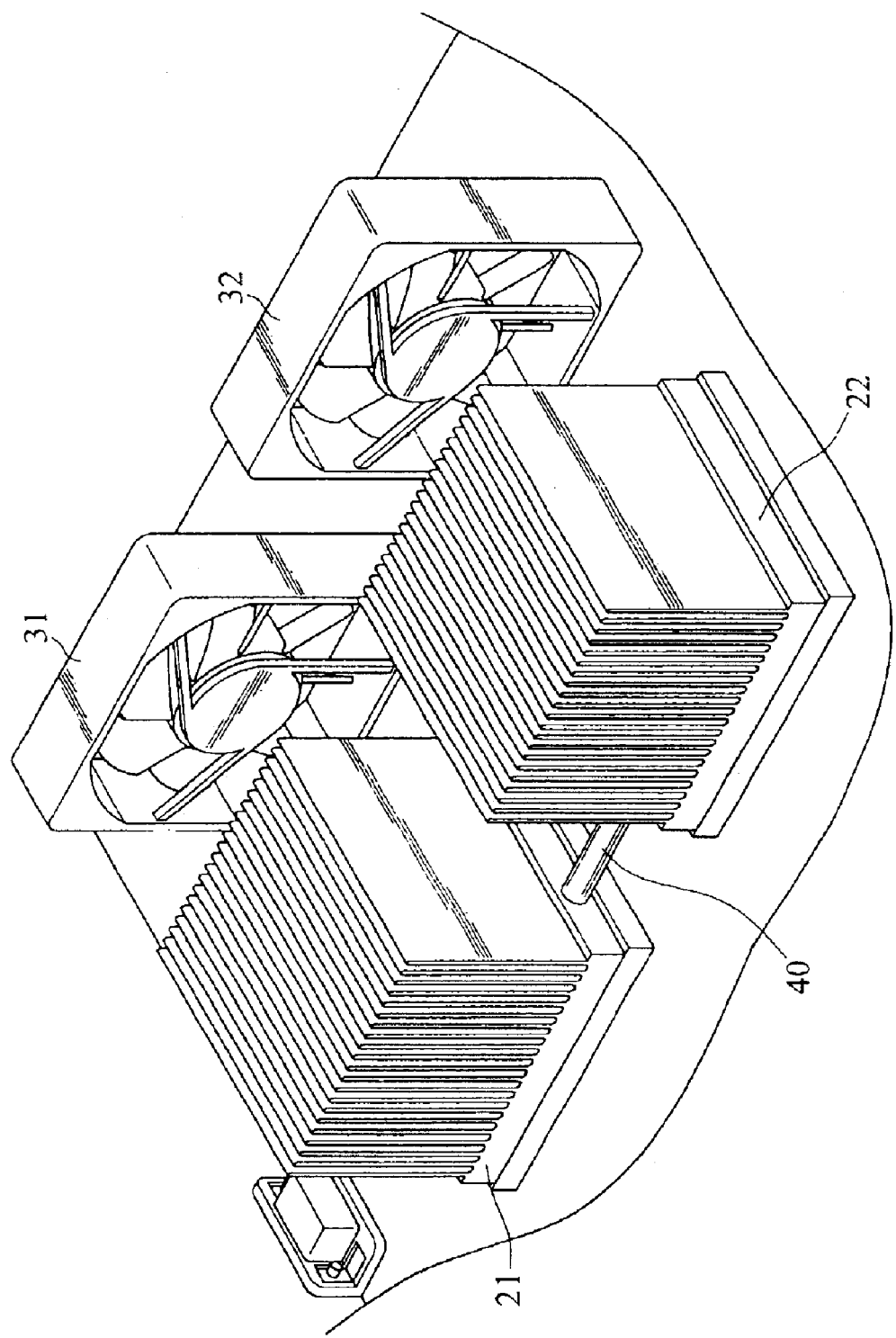
FIG. 5 is a fourth embodiment of the invention.

As shown in FIG. 5, the fourth embodiment uses a heat duct as the heat conductor 40.

The heat duct is a metal duct packaged in vacuum. A fluid with 90% of water is filled inside the duct. The pressure inside the duct is very low so that the fluid can be vaporized at about 30° C. to provide a better heat conduction efficiency.

Fifth Embodiment

Figure 6:
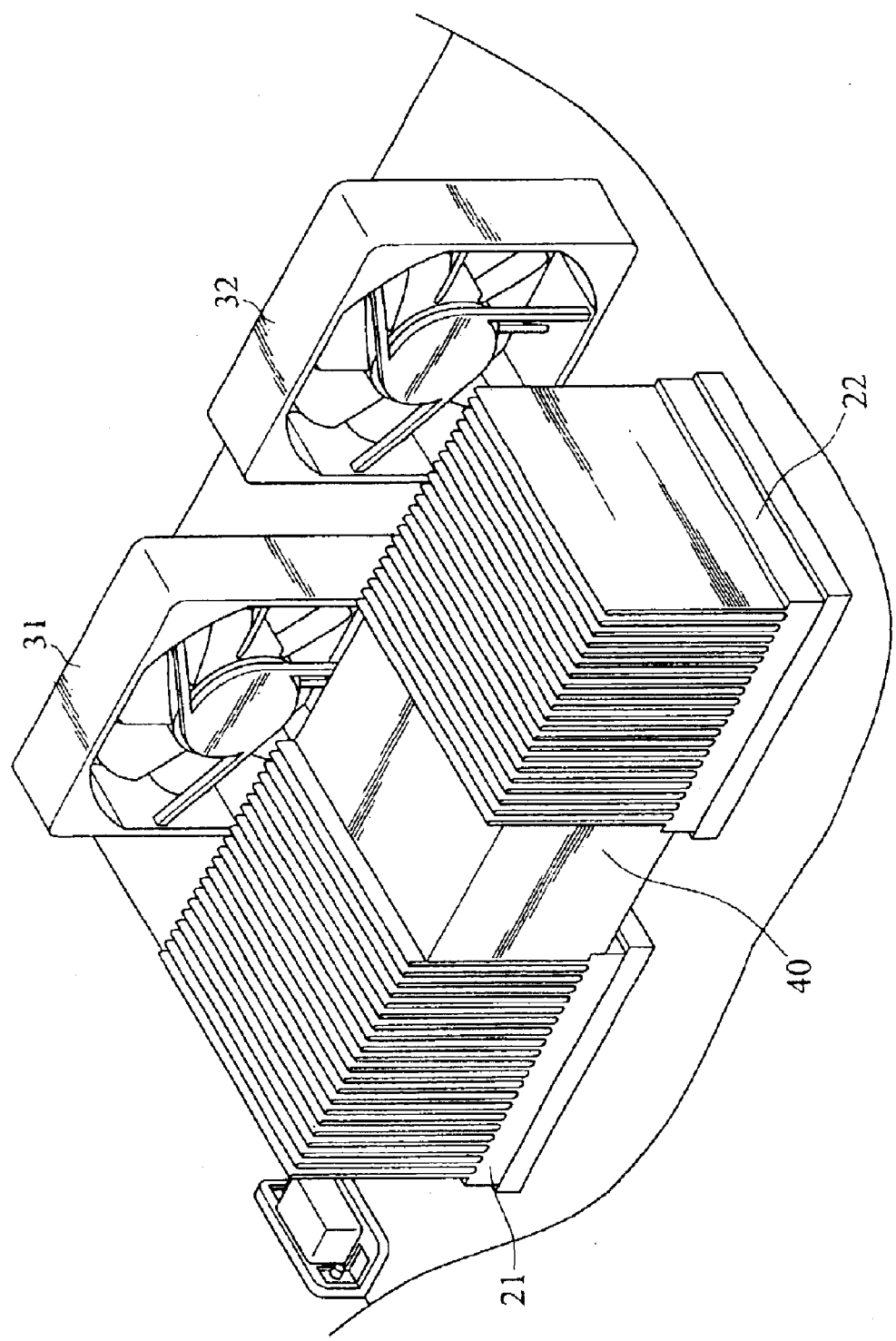
FIG. 6 is a fifth embodiment of the invention.

In the fifth embodiment shown in FIG. 6, the heat conductor 40 is a block. Both sides of the block are directly attached to the fins 212 to increase the heat dissipation area.

Sixth Embodiment

Figure 7:
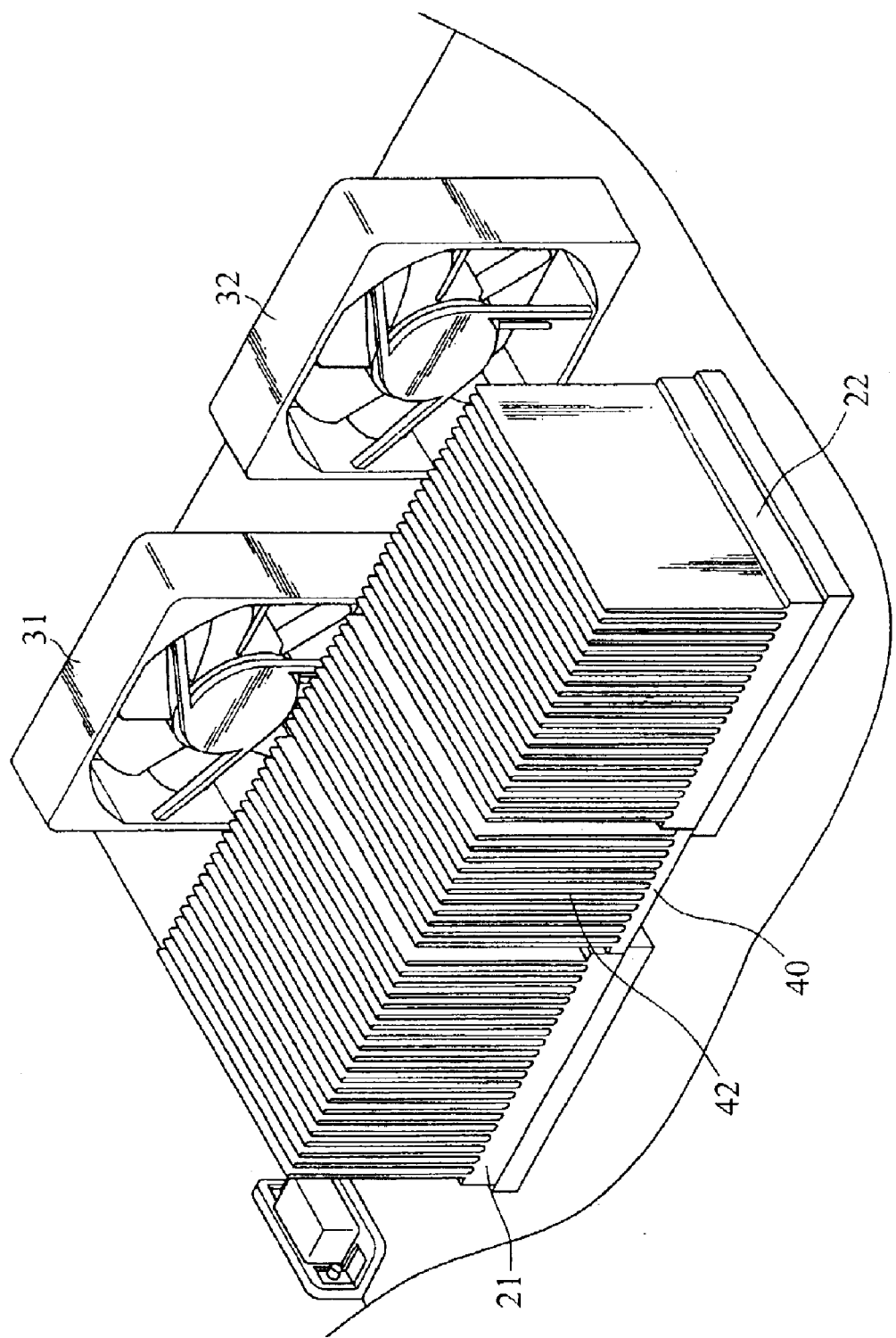
FIG. 7 is a sixth embodiment of the invention.
Figure 8:
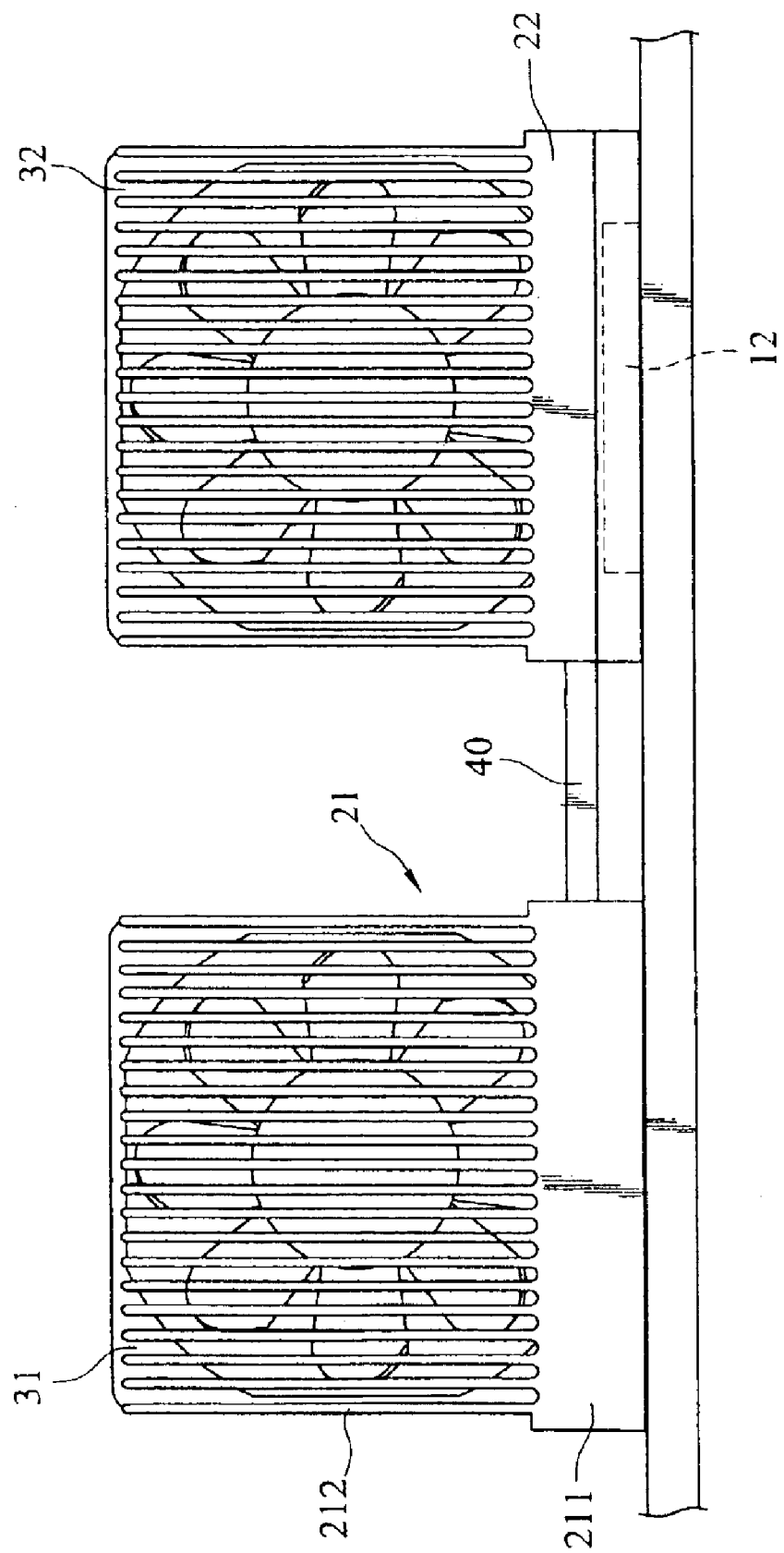
FIG. 8 is a seventh embodiment of the invention.

As shown in FIG. 7, the heat conductor 40 can be further installed with heat dissipating fins 42 so that the heat conductor 40 also has the function of dissipating heat.

In the above-mentioned embodiments, the heat sources and the heat sinks of the electronic device 10 have one-to-one correspondence. In principle, such an electronic device 10 has two processors. The disclosed heat dissipating device can be used in electronic devices with only a single processor. The seventh embodiment defines the first heat sink 21' and the second heat sink 22'. The first sink 21' is in contact with the heat source 11 and the second heat sink 22' is installed on one side of the first sink 21'. Using the heat conductor 40, the heat on the first heat sink 21' is transferred to the second heat sink 22', providing a larger heat dissipation area for the heat source 11.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A heat dissipating device used in an electronic device with a plurality of heat sources, comprising:

a plurality of heat sinks, each of which corresponds to one of the heat sources for taking away the heat on the heat source; and a heat conductor, which has a plurality of heat dissipating fins and connects to the heat sinks to transfer the heat among the heat sinks, wherein the heat conductor is installed on the heat sinks in a dismountable way and wherein each of the heat sinks has a clicking slot and the heat conductor has blocks that match with the clicking slots so that the heat conductor can be mounted onto the heat sinks via the clicking blocks and the clicking slots.

2. The heat dissipating device of claim 1, wherein the heat conductor is a plate made of a highly thermal conductive material.

3. The heat dissipating device of claim 1, wherein the heat conductor is attached to the heat sinks using a heat-conductive adhesive.

4. The heat dissipating device of claim 1, wherein the heat conductor is a heat duct which goes through the plurality of heat sinks.

5. The heat dissipating device of claim 1, wherein a fan is provided for each of the heat sinks.

6. The heat dissipating device of claim 5, wherein each of the fans is installed on top of the associated heat sink.

7. The heat dissipating device of claim 5, wherein each of the fans is installed on one side of the associated heat sink.

8. A heat dissipating device used in an electronic device with one heat source, comprising:

a first heat sink, which is installed on the heat source for taking away its heat;

a second heat sink, which is installed on one side of the first heat sink;

a heat conductor, which has a plurality of heat dissipating fins and is in contact with the first heat sink and the second heat sink for transferring the heat from the first heat sink to the second heat sink, wherein the heat conductor is installed on the heat sinks in a dismountable way and wherein each of the heat sinks has a clicking slot and the heat conductor has blocks that match with the clicking slots so that the heat conductor can be mounted onto the heat sinks via the clicking blocks and the clicking slots.

9. The heat dissipating device of claim 8, wherein the heat conductor is a plate made of a highly thermal conductive material.

10. The heat dissipating device of claim 8, wherein the heat conductor is attached to the heat sinks using a heat-conductive adhesive.

11. The heat dissipating device of claim 8, wherein the heat conductor is a heat duct which goes through the plurality of heat sinks.

12. The heat dissipating device of claim 8, wherein a fan is provided for each of the heat sinks.

13. The heat dissipating device of claim 12, wherein each of the fans is installed on top of the associated heat sink.

14. The heat dissipating device of claim 12, wherein each of the fans is installed on one side of the associated heat sink.

* * * * *